(12) United States Patent
Tanaka

(10) Patent No.: US 8,493,112 B2
(45) Date of Patent: Jul. 23, 2013

(54) SIGNAL PROCESSING APPARATUS

(75) Inventor: Yasuyuki Tanaka, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 45 days.

(21) Appl. No.: 13/208,740

(22) Filed: Aug. 12, 2011

(65) Prior Publication Data

US 2012/0044001 A1 Feb. 23, 2012

(30) Foreign Application Priority Data

Aug. 18, 2010 (JP) ................................. 2010-183270

(51) Int. Cl.
*H03L 7/08* (2006.01)
(52) U.S. Cl.
USPC ........... 327/156; 327/147; 327/150; 327/159; 331/17; 331/25
(58) Field of Classification Search
None
See application file for complete search history.

(56) References Cited

U.S. PATENT DOCUMENTS

| 4,495,474 A * | 1/1985 | Nishikawa et al. ............. 331/11 |
| 5,990,656 A * | 11/1999 | Kardash ........................ 318/807 |
| 6,552,618 B2 * | 4/2003 | Nelson et al. ................... 331/11 |
| 7,804,367 B2 * | 9/2010 | Lee et al. ........................ 331/16 |

FOREIGN PATENT DOCUMENTS

JP 2008-042586 A 2/2008

* cited by examiner

*Primary Examiner* — An Luu
(74) *Attorney, Agent, or Firm* — Canon U.S.A., Inc., IP Division

(57) ABSTRACT

A signal processing apparatus of the present invention includes an input unit configured to receive a reference signal supplied from an external device, a phase detection unit configured to detect a phase difference between the reference signal received from the input unit and a clock signal, a generation unit configured to generate the clock signal with a frequency corresponding to an output of the phase detection unit, and a control unit configured to detect an error between a frequency of the reference signal received from the input unit and the frequency of the clock signal based on an output of the phase detection unit and to output information, which indicates the status of a frequency change in the reference signal, to a display device based on the detected error.

15 Claims, 7 Drawing Sheets

SIGNAL PROCESSING APPARATUS

BACKGROUND OF THE INVENTION

1. Field of the Invention

The present invention relates to a signal processing apparatus.

2. Description of the Related Art

Conventionally, business-use video cameras used in the broadcast field have the function to match the phases and frequencies of the video signals, which are used by a plurality of video cameras, with each other, by synchronizing each operation clock in the camera to the externally generated reference signal (for example, see Japanese Patent Application Laid-Open No. 2008-042586). This function is called the generator lock function.

In addition, the business-use video cameras are required to keep the clock frequencies of a plurality of video cameras synchronized for several hours even if no reference signal is supplied thereto after the generator lock is once performed based on the external reference signal.

For example, the reference signal generating device sometimes cannot supply the reference signal to a plurality of video cameras at a time. In such a case, the generator lock is performed for the video cameras, one at a time, by sequentially connecting the reference signal generating device to the plurality of video cameras.

However, when the generator lock is performed for the video cameras immediately after the reference signal generating device is powered on and the frequency variation of the reference signal output from the device is unstable, the frequency of the operation clock differs among the plurality of video cameras. This will cause the problem that the video signals, imaged and recorded by the video cameras, will become unsynchronized over time.

Therefore, the user must wait until the frequency change in the reference signal from the reference signal generating device becomes stable and, after that, stop the supply of the reference signal to the video camera and stop the generator lock function.

Conventionally, however, the user cannot confirm whether or not the frequency of the reference signal from the reference signal generating device is stable. Therefore, the problem is that the reference signal generating device and the recording device must be kept connected longer than is necessary to perform the generator lock.

SUMMARY OF THE INVENTION

The present invention is directed to a signal processing apparatus that allows the user to easily determine the state of the frequency of the externally generated reference signal.

According to an aspect of the present invention, a signal processing apparatus includes an input unit configured to receive a reference signal supplied from an external device, a phase detection unit configured to detect a phase difference between the reference signal received from the input unit and a clock signal, a generation unit configured to generate the clock signal with a frequency according to an output of the phase detection unit, and a control unit configured to detect an error between a frequency of the reference signal received from the input unit and the frequency of the clock signal based on an output of the phase detection unit and to output information indicating the status of a frequency change in the reference signal to a display device based on the detected error.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1:
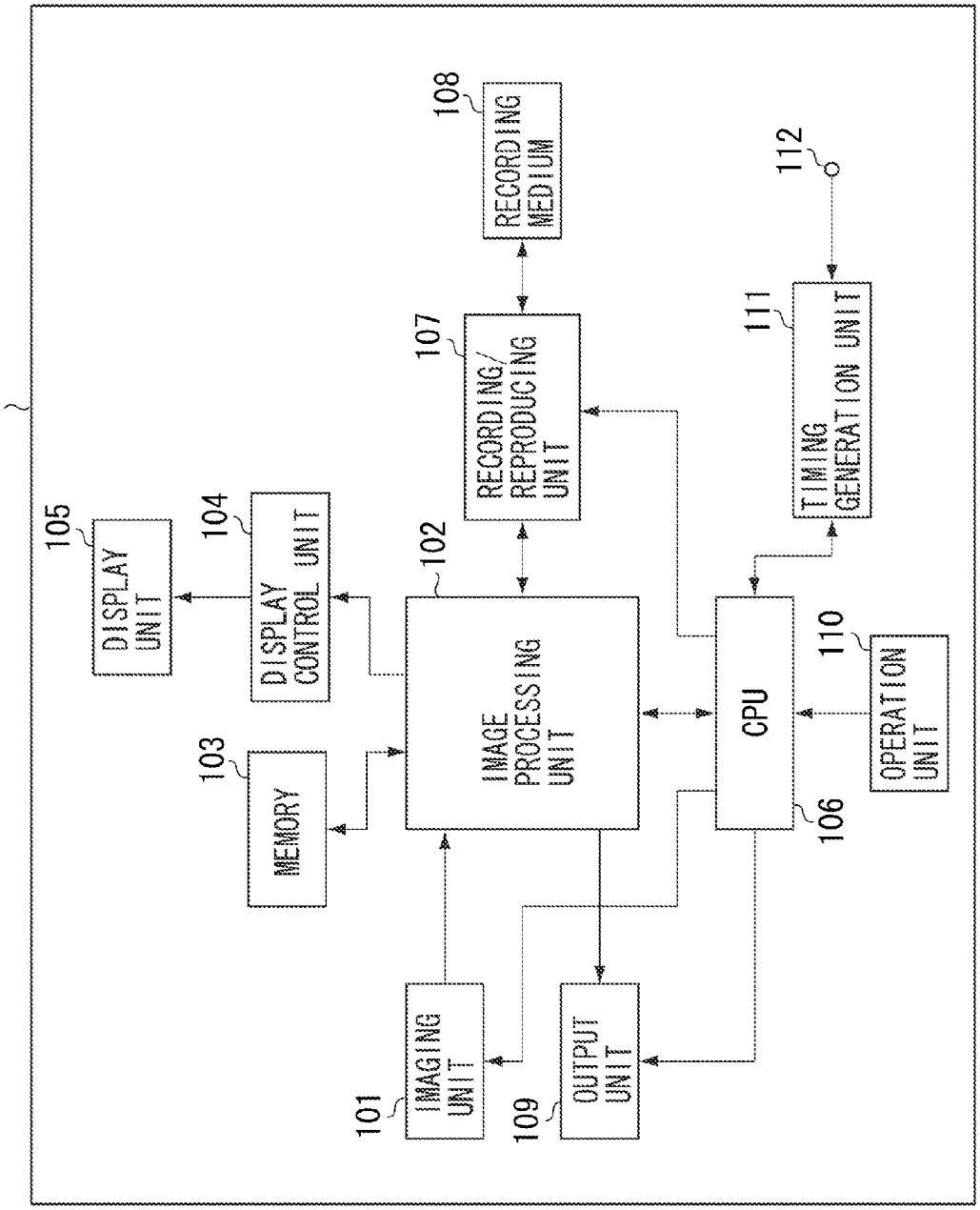
FIG. 1 is a block diagram illustrating a configuration of a video camera in an exemplary embodiment of the present invention.

FIG. 1 is a block diagram illustrating a configuration of a video camera 100 that is the signal processing apparatus according to the present invention.

In FIG. 1, an imaging unit 101 captures the image of an object according to an instruction from a central processing unit (CPU) 106, generates the moving image signal, and outputs the generated moving image signal to an image processing unit 102. During imaging, the image processing unit 102 performs the known compressing and encoding processing on the moving image signal output from the imaging unit 101, according to the instruction from the CPU 106, and outputs the compressed and encoded signal to a recording/reproducing unit 107.

During imaging, the image processing unit 102 also outputs the captured moving image signal to a display control unit 104, which displays the moving image of the object on a display unit 105. During reproduction, the image processing unit 102 decodes and decompresses the reproduced moving image signal, and outputs the decoded and decompressed signal to an output unit 109. The image processing unit 102 also transmits the reproduced moving image signal to the display control unit 104, which displays the reproduced image on the display unit 105.

A memory 103 temporarily stores the moving image signal for processing by the image processing unit 102. The display control unit 104 displays the captured moving image on the display unit 105 at a recording time, and displays the reproduced moving image on the display unit 105 during reproduction. The display control unit 104 also displays various types of information, such as menu information, on the display unit 105 according to an instruction from the CPU 106. The display unit 105 has a display device such as a liquid crystal panel.

The CPU 106 controls the operation of the components of the video camera 100 based on the program stored in a nonvolatile memory (not illustrated). The CPU 106 also controls the components based on an instruction from an operation unit 110. At a recording time, the recording/reproducing unit 107 records the moving image signal, received from the image processing unit 102, on a recording medium 108 and, during reproduction, reproduces the moving image signal, received from the recording medium 108, and outputs the reproduced moving image signal to the image processing unit 102.

The output unit 109 outputs the moving image signal that is output from the image processing unit 102 to an external device. The operation unit 110 has various switches such as a power switch, imaging start/stop switch, and play switch. The user operates the operation unit 110 to give an operation instruction to the video camera 100.

An input terminal 112 receives the reference signal supplied from an external reference signal generating device. A timing generation unit 111 generates the reference clock according to the reference signal supplied to the input terminal 112. The reference clock received from the timing generation unit 111 is used as the operation clock of the components of the video camera 100. The reference signal supplied from the external device includes the horizontal synchronization signal and the vertical synchronization signal.

Next, the basic recording/reproducing processing of the video camera 100 will be described.

When the power is turned on by the operation unit 110, the imaging unit 101 captures an object image and outputs the moving image signal as the digital signal. The image processing unit 102 transmits the captured moving image signal to the display control unit 104, which displays the moving image of the object on the display unit 105 and enters the stand-by state.

When an imaging start instruction is received from the operation unit 110 in the stand-by state, the CPU 106 transmits the imaging start instruction to the image processing unit 102 and the recording/reproducing unit 107. In response to the imaging start instruction, the image processing unit 102 compresses the moving image signal captured by the imaging unit 101, and outputs the compressed signal to the recording/reproducing unit 107. In response to the imaging start instruction, the recording/reproducing unit 107 records the moving image signal received from the image processing unit 102, to the recording medium 108.

Although a flash memory is used as the recording medium 108 in the present exemplary embodiment, any other recording medium may be used. A mounting/ejecting mechanism (not illustrated) may also be installed in the video camera 100 for allowing the user to mount and eject the recording medium 108 easily.

When an imaging stop instruction is received from the operation unit 110, the CPU 106 transmits the imaging stop instruction to the image processing unit 102 and the recording/reproducing unit 107. In response to the imaging stop instruction, the image processing unit 102 stops the compression processing of the moving image signal, and the recording/reproducing unit 107 stops the recording of the moving image signal. In present exemplary embodiment, the moving image signal recorded from the start of imaging to the stop of imaging is recorded on the recording medium 108 as one file.

The CPU 106 controls the operation timing of the components according to the reference clock, vertical synchronization signal, and horizontal synchronization signal output from the timing generation unit 111. The CPU 106 contains a timer that generates a time code, which indicates the time elapsed from the start of recording (hour, minute, frame), according to the reference clock output by the timing generation unit 111, and outputs the generated time code to the recording/reproducing unit 107.

The recording/reproducing unit 107 records each frame of the moving image signal with the time code appended. In addition, the CPU 106 can transmit the generated time code to the display control unit 104 via the image processing unit 102 to display the time code, as well as the captured moving image, on the display unit 105.

Next, the processing performed during reproduction will be described. When the reproduction instruction of a moving image recorded on the recording medium 108 is received from the operation unit 110, the CPU 106 instructs the recording/reproducing unit 107 to reproduce the specified moving image signal from the recording medium 108. The recording/reproducing unit 107 reproduces the specified moving image signal from the recording medium 108, and outputs the reproduced moving image signal to the image processing unit 102.

The image processing unit 102 decodes the reproduced moving image signal and outputs the reproduced moving image signal to the display control unit 104. The display control unit 104 displays the reproduced moving image on the display unit 105. In addition, the image processing unit 102 outputs the reproduced moving image signal to the output unit 109. The output unit 109 outputs the moving image signal that is output from the image processing unit 102 to an external device.

Next, the generator lock processing performed by the timing generation unit 111 will be described. In the present exemplary embodiment, the user first operates the operation unit 110 to set the generator lock mode. After the generator lock mode is set, the timing generation unit 111 starts the generator lock processing when the CPU 106 detects that the reference signal is supplied to the input terminal 112 from the reference signal generating device.

Figure 2:
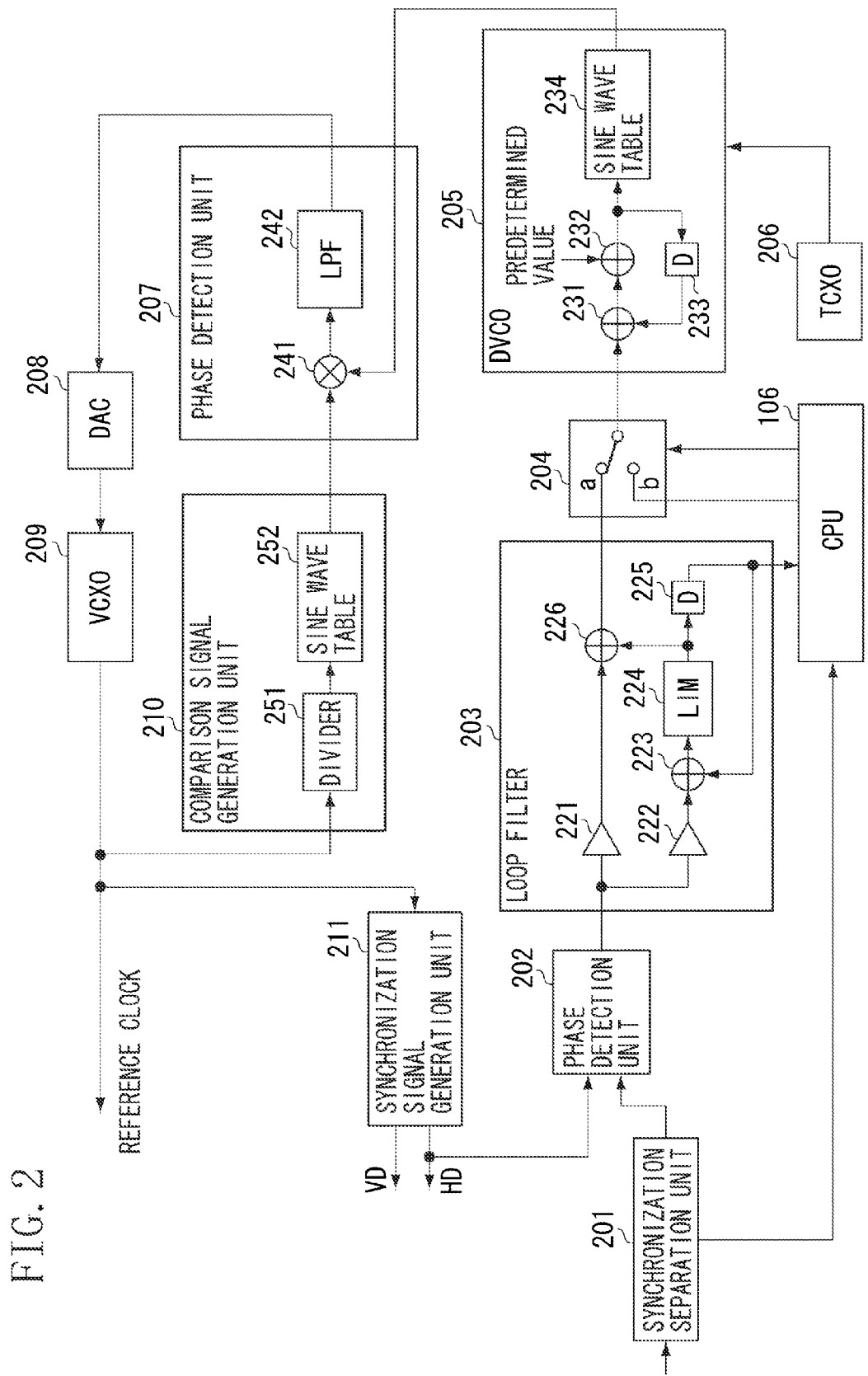
FIG. 2 is a block diagram illustrating a configuration of a timing generation unit.

FIG. 2 is a block diagram illustrating a main part configuration of the signal processing apparatus 100 that includes the timing generation unit 111.

Referring to FIG. 2, the reference signal received from the input terminal 112 is supplied to a synchronization separation unit 201. The synchronization separation unit 201 detects the horizontal synchronization signal from the received reference signal, and outputs the detected horizontal synchronization signal to a phase detection unit 202. In addition, when the reference signal is received, the synchronization separation unit 201 informs the CPU 106 that the reference signal has been received.

The horizontal synchronization signal generated by the synchronization signal generation unit 211 from the reference clock is also supplied to the phase detection unit 202. The phase detection unit 202 detects the phase difference between the horizontal synchronization signal received from the synchronization separation unit 201 and the horizontal synchronization signal received from the synchronization signal generation unit 211, and outputs the signal, which indicates the detected phase difference, to multipliers 221 and 222 of a loop filter 203.

The multiplier 221 multiples the phase difference signal from the phase detection unit 202 by a predetermined coefficient, and outputs the result to an adder 226. The phase difference signal from the phase detection unit 202 is supplied to the multiplier 222.

An integration circuit composed of the multiplier 222, an adder 223, a limiter 224, and a register 225 performs the integration processing for this phase difference signal. The integrated value of the phase difference signal from the limiter 224 is output to the adder 226. The adder 226 adds up the phase difference signal from the multiplier 221 and the integrated value from the limiter 224, and outputs the result to terminal "a" of a switch 204.

The CPU 106 reads the integrated value of the phase difference signal accumulated in a register 225. When the phase of the reference clock and the phase of the reference signal from the external device are synchronized, the average value of the frequency difference between the reference signal from the external device and the reference clock is accumulated in the register 225. Therefore, the CPU 106 can read the output of the register 225 to detect the frequency difference between the frequency of the reference signal from the external device and the frequency of the reference clock.

In addition, the CPU 106 can compare the plurality of outputs of the register 225, which are acquired at a regular interval, to detect the state of the change in the reference signal from the external device. The value of the register 225 is the integration result of the phase difference signal, and therefore is stable with no sudden change in the numeric value that is read.

The setting value from the CPU 106 is supplied to the terminal "b" of the switch 204. The switch 204 is controlled by the CPU 106. While the reference signal is supplied from the external device, the CPU 106 keeps the switch 204 connected to the terminal "a". When the supply of the reference signal is stopped, the CPU 106 connects the switch 204 to the terminal "b".

The output from the switch 204 is supplied to a digital voltage-controlled oscillator (DVCO) 205. The DVCO 205, which operates according to the timing signal from a temperature-compensated crystal oscillator (TCXO) 206, generates the sine wave signal with the frequency determined according to the phase difference between the reference signal and the clock.

The TCXO 206, a temperature-compensated crystal oscillator, generates a constant-frequency clock that is almost unaffected by a temperature change. The temperature characteristics of the TCXO are ±1.5 parts per million (ppm) at −30° C. to 85° C. centigrade. In the description below, the frequency of the clock generated by the TCXO 206 is assumed to be 26 megahertz (MHz).

Each time the clock is received from the TCXO 206, an adder 231 adds up the phase difference signal from the switch 204 and the output of a register 233, and outputs the result to an adder 232. Each time the clock is received from the TCXO 206, the adder 232 adds a predetermine value to the output from the adder 231. To the adder 232, the predetermined value is supplied from the CPU 106.

In the present exemplary embodiment, the frequency of the sine wave signal from the DVCO 205 becomes the center frequency when the output from the loop filter 203 is 2048. The frequency of the sine wave signal output from the DVCO 205 becomes the minimum frequency when the output from the loop filter 203 is 0. The frequency of the sine wave signal output from the DVCO 205 becomes the maximum frequency when the output from the loop filter 203 is 4095.

In the present exemplary embodiment, the value supplied to the adder 232 is 8709219 (84E463 in hexadecimal). The adders 231 and 232 and the register 233 each have 31 bits in length. An overflow, if generated during the addition, is ignored.

The high-order 8 bits of the addition result of the adder 232 are output to a sine wave table 234. The sine wave table 234 generates a sine wave signal according to the received 8-bit value. In the sine wave table 234, each of the received 8-bit values corresponds to a phase in one period of the sine wave.

For example, when the value 2048 is supplied from the switch 204 to the DVCO 205, the one-round period of the 31-bit register 233 is calculated as $(2^{31} \div (8709219+2048)) \div 26e6 = 9.48146e-6$. Therefore, when the added numeric value is n, the frequency in hertz of the sine wave signal output from the sine wave table 234 is as shown in expression (1).

$$\text{Frequency} = 26E6 \times (8709219+n) \div 2^{31} \quad (1)$$

As described above, the DVCO 205 generates the sine wave with the frequency related by expression (1) using the 12-bit value in the range 0-4095 output from the loop filter 203. Therefore, the frequency of the sine wave signal from the DVCO 205 varies according to the value of the phase difference signal from the loop filter 203.

The sine wave signal from the DVCO 205 is output to a multiplier 241 of a phase detection unit 207. To the multiplier 241, the sine wave signal from a comparison signal generation unit 210 is added. The phase detection unit 207 detects the phase difference between these two sine wave signals, and outputs the signal, which indicates the phase difference, to a DA converter 208.

The phase detection unit 207 includes the multiplier 241 and a low pass filter (LPF) 242. When the two sine wave signals are multiplied, the two components, the difference component $\cos(\alpha-\beta)$ and the double frequency component $\cos(\alpha+\beta)$, corresponding to the phase difference are generated by sum-of-products formula (2) given below. The phase detection unit 207 removes the double frequency component from these two components with the use of the LPF 242 to extract the lower phase difference component.

$$\sin\alpha \sin\beta = -1/2\{\cos(\alpha+\beta) - \cos(\alpha-\beta)\} \quad (2)$$

The DA converter 208 converts the phase difference signal to the analog signal, and outputs the converted analog signal to a voltage-controlled crystal oscillator (VCXO) 209. The VCXO 209 is a crystal oscillator that can change the oscillation frequency in the range of about ±150 ppm according to the applied voltage.

Assume that the center frequency of the VCXO 209 is 27 MHz. The clock generated by the VCXO 209 is supplied to the components as the reference clock of the video camera 100. The clock from the VCXO 209 is output also to the comparison signal generation unit 210 and the synchronization signal generation unit 211.

The comparison signal generation unit 210 divides the frequency of the output from the VCXO 209 using a divider 251 composed of an 8-bit counter. The comparison signal generation unit 210 adds the numeric values 0-255, obtained as the result of the division, to a sine wave table 252 to generate a sine wave signal whose one period is formed by 0-255. Since the 27 MHz clock is divided by 256, the frequency of the generated sine wave signal is 105468.75 Hz±150 ppm. This sine wave signal is output to the phase detection unit 207.

The synchronization signal generation unit 211 divides the 27 MHz clock, output by the VCXO 209, to generate the horizontal synchronization signal and the vertical synchronization signal to output to the components. Since it is assumed in the present exemplary embodiment that the video camera 100 processes the NTSC moving image signal, the synchronization signal generation unit 211 generates the horizontal synchronization signal and the vertical synchronization signal with the frequency corresponding to the NTSC system.

As described above, the phase difference signal detected by the phase detection unit 202 is averaged by the loop filter 203. By adding the output of the loop filter 203 to the DVCO 205 that operates according to the clock generated by the TCXO 206, the DVCO 205 generates the temperature-compensated sine wave signal, and adds the signal to the phase detection unit 207.

The DA converter 208 converts the output of the phase detection unit 207 to the digital signal, and outputs the converted signal to the VCXO 209. The configuration described above forms a feedback loop in which the horizontal synchronization signal output from the synchronization signal generation unit 211 is phase-locked to the reference signal received from the external device.

Since the center frequency of the VCXO 209 is 27 MHz, the frequency of the sine wave signal generated by the DVCO 205 is multiplied to 27 MHz as shown by expression (3).

$$\text{Oscillation frequency of VCXO 209} = \text{Frequency of DVCO 205} \times \text{Division ratio of divider 251} \quad (3)$$

In this way, based on the predetermined value supplied to the DVCO 255 (value supplied to the adder 232), the temperature-compensated, frequency-changeable 27 MHz clock can be output from the VCXO 209 as the reference clock.

Therefore, the VCXO 209, which has the linear relationship between given-numeric-value and frequency characteristics, can generate the reference clock according to the constant supplied from the CPU 106 to the adder 232, with being subjected to almost no effect of the temperature drift.

The configuration illustrated in FIG. 2 has a large feedback loop (phase detection unit 202→loop filter 203→DVCO 205→phase detection unit 207→DA converter 208→VCXO 209→synchronization signal generation unit 211→phase detection unit 202).

This large loop includes a small feedback loop (phase detection unit 207→DA converter 208→VCXO 209→comparison signal generation unit 210→phase detection unit 207). This loop configuration requires that the loop gain of the latter is several times larger than the loop gain of the former.

Figure 3:
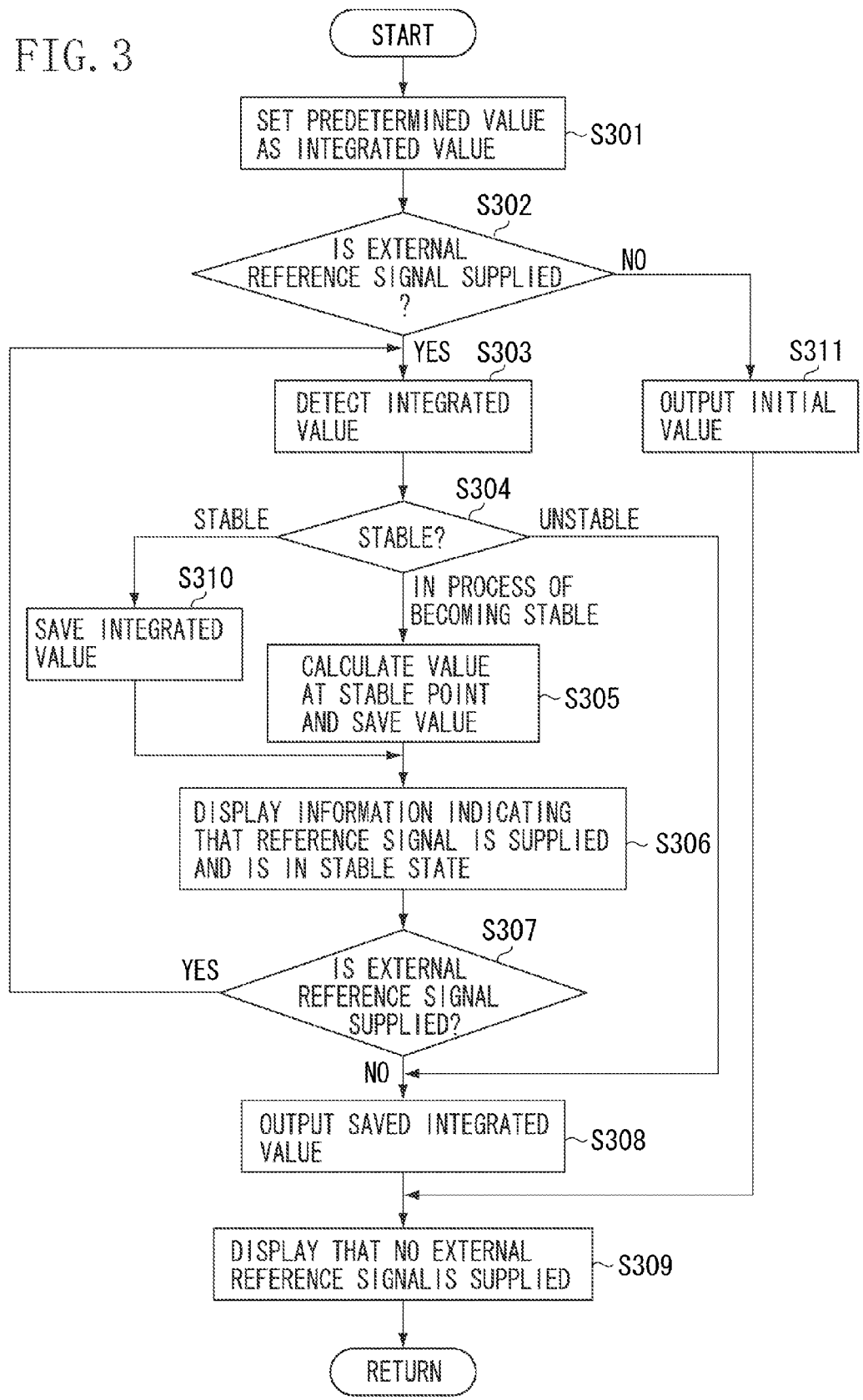
FIG. 3 is a flowchart illustrating generator lock processing.

Next, the generator lock processing performed by the CPU 106 will be described. FIG. 3 is a flowchart illustrating the generator lock processing performed by the CPU 106.

In step S301, when the user operates the operation unit 110 to set the generator lock mode, the CPU 106 sets a predetermined value as the initial value of the integrated value used in the loop filter 203. The initial value that is set in this step is the value used for oscillating the VCXO 209 under free-running conditions until the reference signal is supplied from an external device. This value, which is set at shipment time, is saved in the nonvolatile memory in the CPU 106.

Next, in step S302, the CPU 106 checks the input terminal 112 to determine if the reference signal is supplied from an external reference signal-generating device. If the reference signal is not supplied from the external device (NO in step S302), the CPU 106 outputs the initial value, which is set in step S301, to the terminal "b" of the switch 204 in step S311 and, in addition, connects the switch 204 to terminal "b" for supplying the initial value to the DVCO 205. In step S309, the CPU 106 controls the display control unit 104 and displays the information on the display unit 105 to indicate that no reference signal is supplied from the external device.

If the reference signal is supplied from the external device (YES in step S302), the CPU 106 connects the switch 204 to the terminal "a" for supplying the output of the loop filter 203 to the DVCO 205. At this time, the phase detection unit 202 detects the phase difference between the horizontal synchronization signal from the synchronization signal generation unit 211 and the horizontal synchronization signal from the external device. The integrated value of the phase difference signal is accumulated in the register 225 of the loop filter 203.

After that, in step S303, the CPU 106 acquires the output signal (integrated value) of the register 225 at a predetermined timing and saves the acquired value in an internal register. In step S304, the CPU 106 detects a change in the frequency of the externally supplied reference signal based on the saved integrated value to determine if the frequency change is stable.

For example, the CPU 106 regularly acquires the value of the register 225 at a predetermined timing and saves the acquired value. After acquiring the value of the register 225 a predetermined number of times, the CPU 106 calculates the difference among the values that were saved the predetermined number of times.

The CPU 106 compares the difference value with a plurality of thresholds to determine if the externally supplied reference signal is in the stable state, in the process of becoming stable, or in the unstable state.

In step S310, if the reference signal is in the stable state as the result of the determination, the CPU 106 acquires the value of the register 225 and saves the acquired value in the internal register. In step S306, the CPU 106 controls the display control unit 104 to display the information on the display unit 105 to indicate that the reference signal is supplied and the frequency change of the reference signal is stable.

In step S307, the CPU 106 detects again if the reference signal is received. If the reference signal is received (YES in step S307), the processing returns to step S303. If the supply of the external reference signal is stopped (NO in step S307), the CPU 106 connects the switch 204 to the terminal "b" and, in step S308, outputs the integrated value saved in step S310 to the DVCO 205. In step S309, the CPU 106 controls the display control unit 104 to display the information on the display unit 105 to indicate that no reference signal is supplied from the external device.

If there is no reference signal from the external device as in the case described above, the CPU 106 outputs the value of the register 225, which was saved last while the reference signal was received, to the DVCO 205 via the switch 204 to generate the temperature-compensated reference clock.

In step S305, if the frequency change of the reference signal from the external device is determined to be in the process of becoming stable in step S304, the CPU 106 calculates the estimated integrated value of the case where the frequency change becomes stable, based on the value saved in the register 225.

Figure 4:
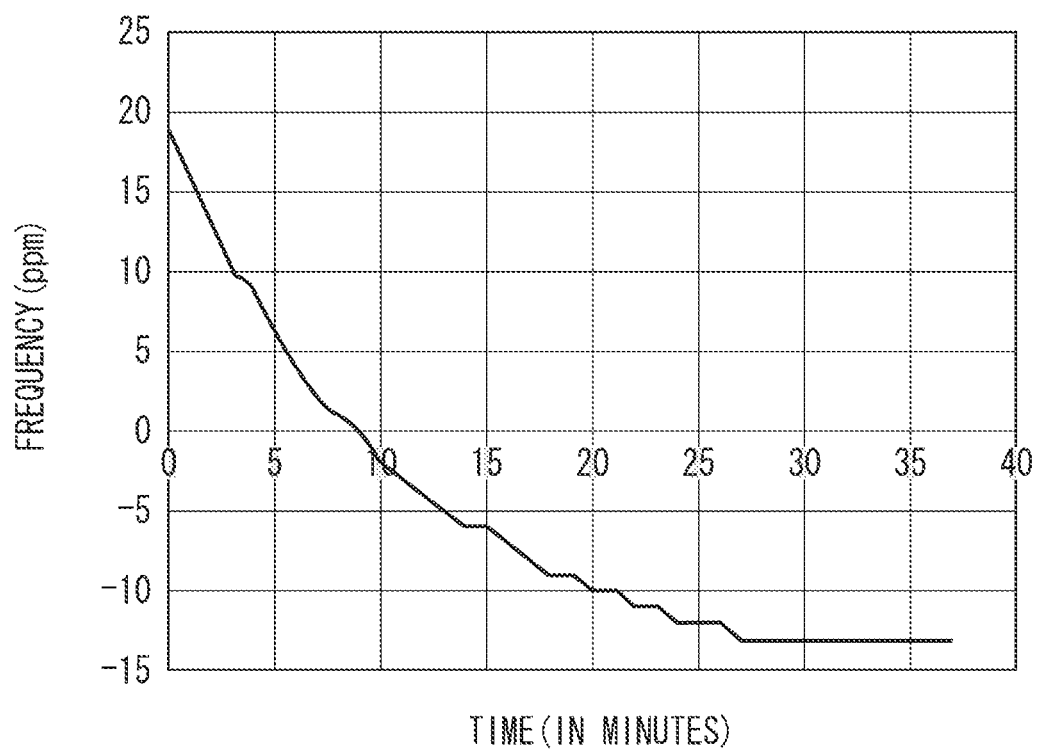
FIG. 4 is a graph illustrating a frequency change of a voltage-controlled crystal oscillator.

For example, when the external reference signal generating device generates the reference signal using a VCXO, it takes about 30 minutes for the oscillation frequency of the VCXO to become stable after the power-on as illustrated in FIG. 4. The characteristics are represented by the exponential function curve given by expression (4).

$$y = a \cdot \exp(-b \cdot x) + c \quad (4)$$

The CPU 106 calculates the variables of expression (4) based on the saved integrated value, calculates the numeric value at the stable point of time, and saves the numeric value. In step S306, the CPU 106 controls the display control unit 104 and displays the information on the display unit 105 to indicate that the reference signal is supplied and the frequency change of the reference signal is stable.

After that, in step S307, the CPU 106 detects again if the reference signal is received and, if the reference signal is received (YES in step S307), the processing returns to step S303. If the supply of the external reference signal is stopped (NO in step S307), the CPU 106 connects the switch 204 to the terminal "b" and, in step S308, outputs the integrated value saved in step S310 to the DVCO 205.

In the present exemplary embodiment, when the generator lock processing is performed in which the internal clock is synchronized with the reference signal supplied from the external device, the CPU 106 detects the frequency change of the reference signal based on the phase difference signal as described above. The CPU 106 determines if the frequency change of the reference signal is stable and displays the determination result. This allows the user to easily determine if the generator lock processing is performed in the state in which the frequency change of the reference signal is stable.

Therefore, the user can perform the generator lock processing after the frequency change of the reference signal becomes stable and, then, stop the supply of the reference signal to the video camera, and supply the reference signal to another video camera.

Next, a second exemplary embodiment will be described. In the present exemplary embodiment, the configuration of a video camera 100 is similar to that illustrated in FIG. 1 and FIG. 2, and the basic recording and reproduction processing is similar to that in the first exemplary embodiment. In the second exemplary embodiment, the generator lock processing is different from that of the first exemplary embodiment.

Figure 5:
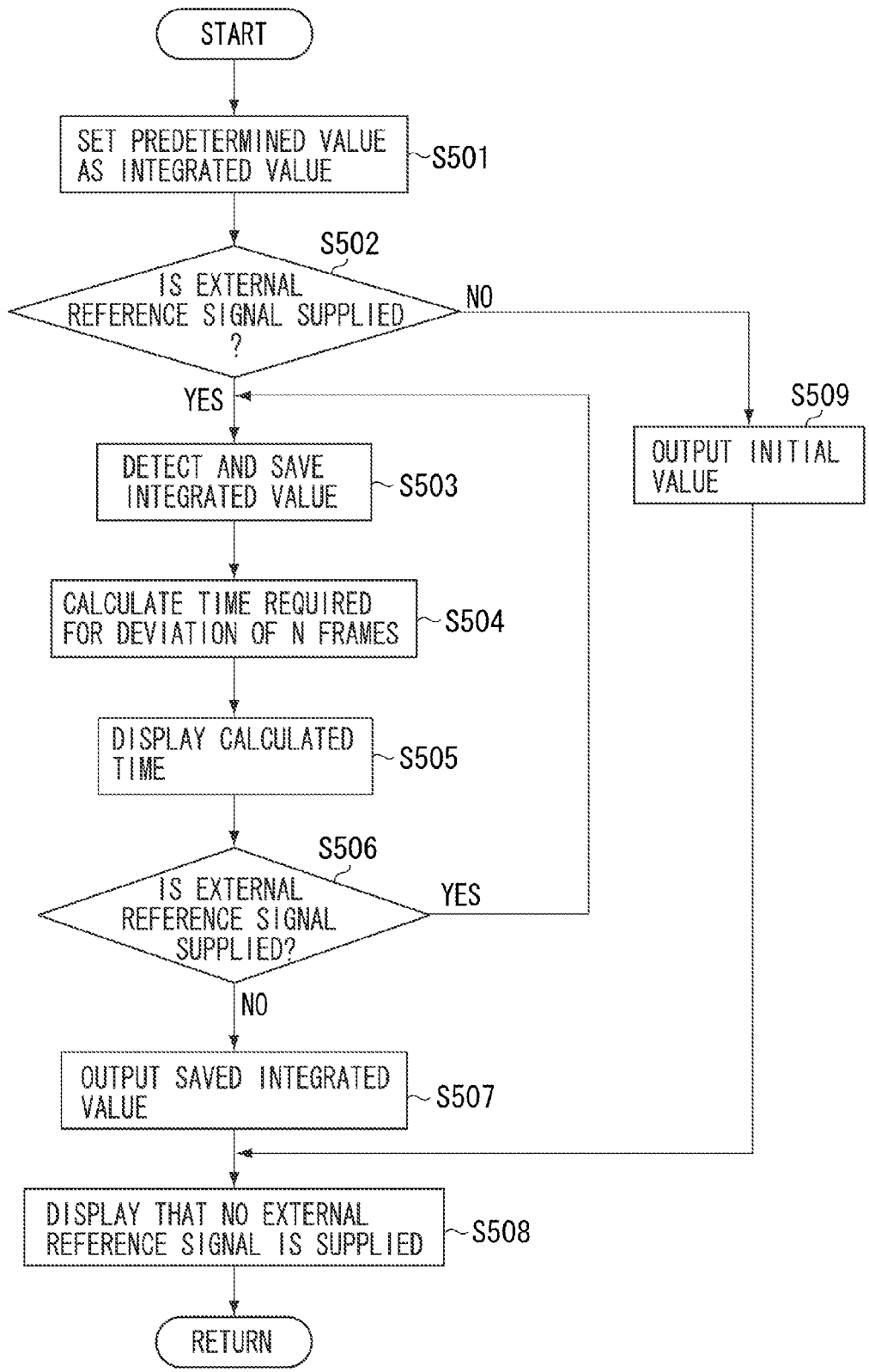
FIG. 5 is a flowchart illustrating the generator lock processing.

FIG. 5 is a flowchart illustrating the generator lock processing according to the second exemplary embodiment. The CPU 106 controls the components to perform the processing in FIG. 5.

In step S501, when the user operates the operation unit 110 to set the generator lock mode, the CPU 106 sets a predetermined value as the initial value of the integrated value used in the loop filter 203. The initial value that is set in this step is the value used for oscillating the VCXO 209 under free-running conditions until the reference signal is supplied from an external device. This value, which is set at shipment time, is saved in the memory in the CPU 106.

Next, in step S502, the CPU 106 checks the input terminal 112 to determine if the reference signal is supplied from an external reference-signal generating device. If the reference signal is not supplied from the external device (NO in step S502), the CPU 106 outputs the initial value, which is set in step S501, to terminal b of the switch 204. In addition, in step S509, the CPU 106 connects the switch 204 to the terminal "b" for supplying the initial value to the DVCO 205. In step S508, the CPU 106 controls the display control unit 104 and displays the information on the display unit 105 to indicate that no reference signal is supplied from the external device.

If the reference signal is supplied from the external device (YES in step S502), the CPU 106 connects the switch 204 to the terminal "a" for supplying the output of the loop filter 203 to the DVCO 205. At this time, the phase detection unit 202 detects the phase difference between the clock and the horizontal synchronization signal from the external device. The integrated value of the phase difference signal is accumulated in the register 225 of the loop filter 203.

After that, in step S503, the CPU 106 regularly acquires the output signal (integrated value) of the register 225 at a predetermined timing, and saves the acquired value in the internal register. The CPU 106 calculates the frequency deviation amount of the externally supplied reference signal based on the saved integrated value.

In step S504, based on this frequency deviation amount, the CPU 106 calculates the time required to generate deviation of N frames (N is a predetermined integer equal to or larger than 1) between the time (number of frames) measured using the external reference signal and the time (number of frames) measured using the reference clock from the VCXO 209. In step S505, the CPU 106 displays the calculated time information on the display unit 105 via the display control unit 104.

In step S506, the CPU 106 detects again if the reference signal is received. If the reference signal is received (YES in step S506), the processing returns to step S503. In this way, the CPU 106 calculates the time required to generate deviation of N frames, at periodic intervals while the reference signal is received from the external device and displays the calculated time on the display unit 105.

If the supply of the external reference signal is stopped (NO in step S506), the CPU 106 connects the switch 204 to the terminal "b" and, in step S507, outputs the integrated value saved in step S503 to the DVCO 205. In step S508, the CPU 106 controls the display control unit 104 and displays the information on the display unit 105 to indicate that no reference signal is supplied from the external device.

Next, the calculation processing in step S504 and the display processing in step S505, will be described. The relational expressions are $$T = N \div \Delta f \div 108000 \text{ (NTSC broadcast method)}$$

$$T = N \div \Delta f \div 90000 \text{ (PAL broadcast method)} \quad (5)$$

where $\Delta f$ is the frequency deviation and T is the time elapsed until deviation of N frames is generated.

Figure 7A:
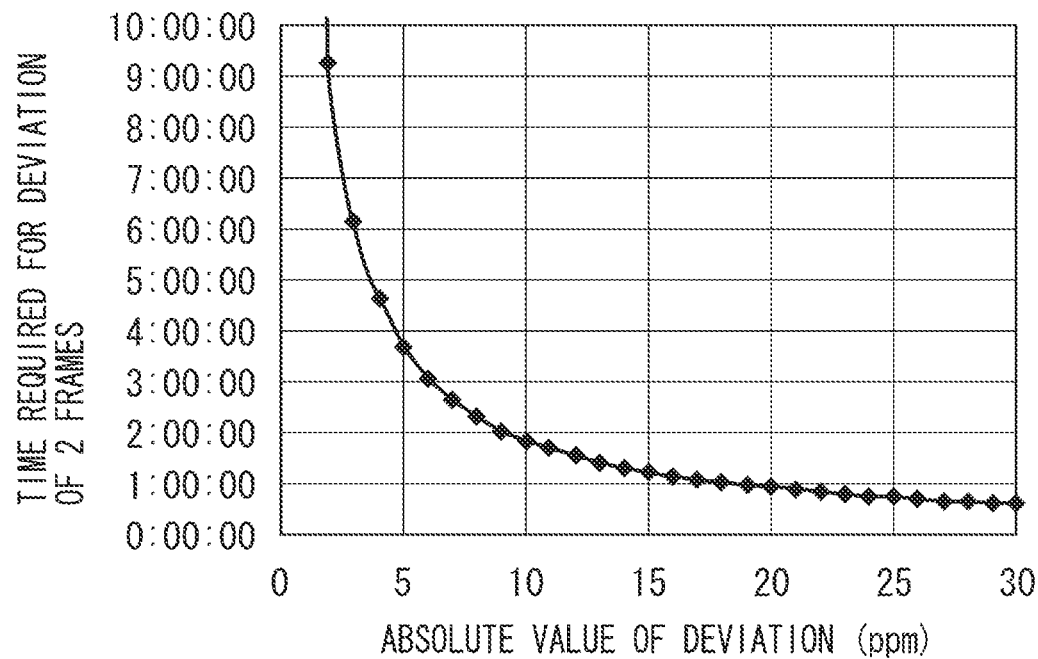
FIGS. 7A and 7B are graphs illustrating relations between a frequency deviation of the external reference signal and time required for deviation of 2 frames, and between the frequency deviation of the external reference signal and the frame deviation amount after 2 hours.

As indicated by the above expression, if the frequency deviation amount $\Delta f$ is known, the time T required for deviation of N frames may be calculated by expression (5). For example, FIG. 7A illustrates the relation between the time T required for deviation of 2 frames, and the frequency deviation amount $\Delta f$ when the broadcast method of the moving image signal processed by the signal processing apparatus 100 is NTSC.

The frequency variation of the reference clock is extremely low in the present exemplary embodiment because the temperature-compensated reference clock is generated. For example, when the frequency variation of the reference clock from the VCXO 209 is 1.5 ppm as described above, the time required for deviation of 2 frames is 10 hours or longer (12 hours and 20 minutes) as shown in FIG. 7A.

On the other hand, when the device that generates the external reference signal generates the reference signal using a VCXO that is not temperature-compensated, the frequency variation of the reference signal can be about 10 ppm in some cases. Therefore, the error of 2 frames may be caused within 2 hours, for example, 3 hours and 42 minutes for 5 ppm of frequency variation and 1 hour and 51 minutes for 10 ppm of frequency variation, as illustrated in FIG. 7A.

In addition, the signal processing apparatus 100 in the present exemplary embodiment holds the frequency even if the reference signal is stopped after the generator lock processing is performed based on the reference signal from an external device. Therefore, if the external reference signal also holds the state, no error from the external reference signal is generated.

However, if the frequency of the reference signal of the external signal-generating device is deviated originally in the range of several ppm to several dozens of ppm, the frequency tends to deviate in many cases due to an ambient change such as a temperature change. To address this issue, the CPU 106 displays the time that will elapse until deviation of N frames is generated based on the frequency variation in the external reference signal. This display helps the user easily recognize an approximate time that is required until the deviation of N frames is generated.

In addition, as is understood from FIG. 7A, the frequency deviation amount is inversely proportional to the time required for deviation of N frames. This means that, once the deviation starts increasing from the point where there is no deviation, the amount of deviation rapidly decreases to a certain level. To ensure accuracy, some external signal-generating devices have a TCXO or a crystal oscillator placed in an oven, where the temperature is higher than the room temperature, to keep it at a constant temperature.

On the other hand, some signal processing apparatuses accept a frequency deviation or drift of about several dozens of ppm. In such a case, the smaller value, that is, the state in which the shorter time is required for deviation of N frames, is always displayed in the present exemplary embodiment as the time required for deviation of N frames. When the frequency deviation amount of the reference signal received from the external device is small but has a variation (drift), the displayed time does not become stable, and varies.

As described above, the user can recognize the time displayed during the generator lock processing to easily recognize the information indicating that there is no worry about deviation even for long-time imaging, deviation of N frames will be generated in a short period of time due to a fixed amount of deviation, or the frequency of the reference signal has a small amount of deviation but has a variation.

In the present exemplary embodiment, the user can operate the operation unit 110 to arbitrarily change the number of frames, N, used in steps S504 and S505. When the user changes N, the CPU 106 recalculates the time required for deviation of N frames using expression (5) and displays the result on the display unit 105.

Next, a third exemplary embodiment will be described. In the present exemplary embodiment, the configuration of a video camera 100 is similar to that illustrated in FIG. 1 and FIG. 2, and the basic recording and reproduction processing is similar to that in the first exemplary embodiment. In the third exemplary embodiment, the generator lock processing is different from that of the first and second exemplary embodiments.

Figure 6:
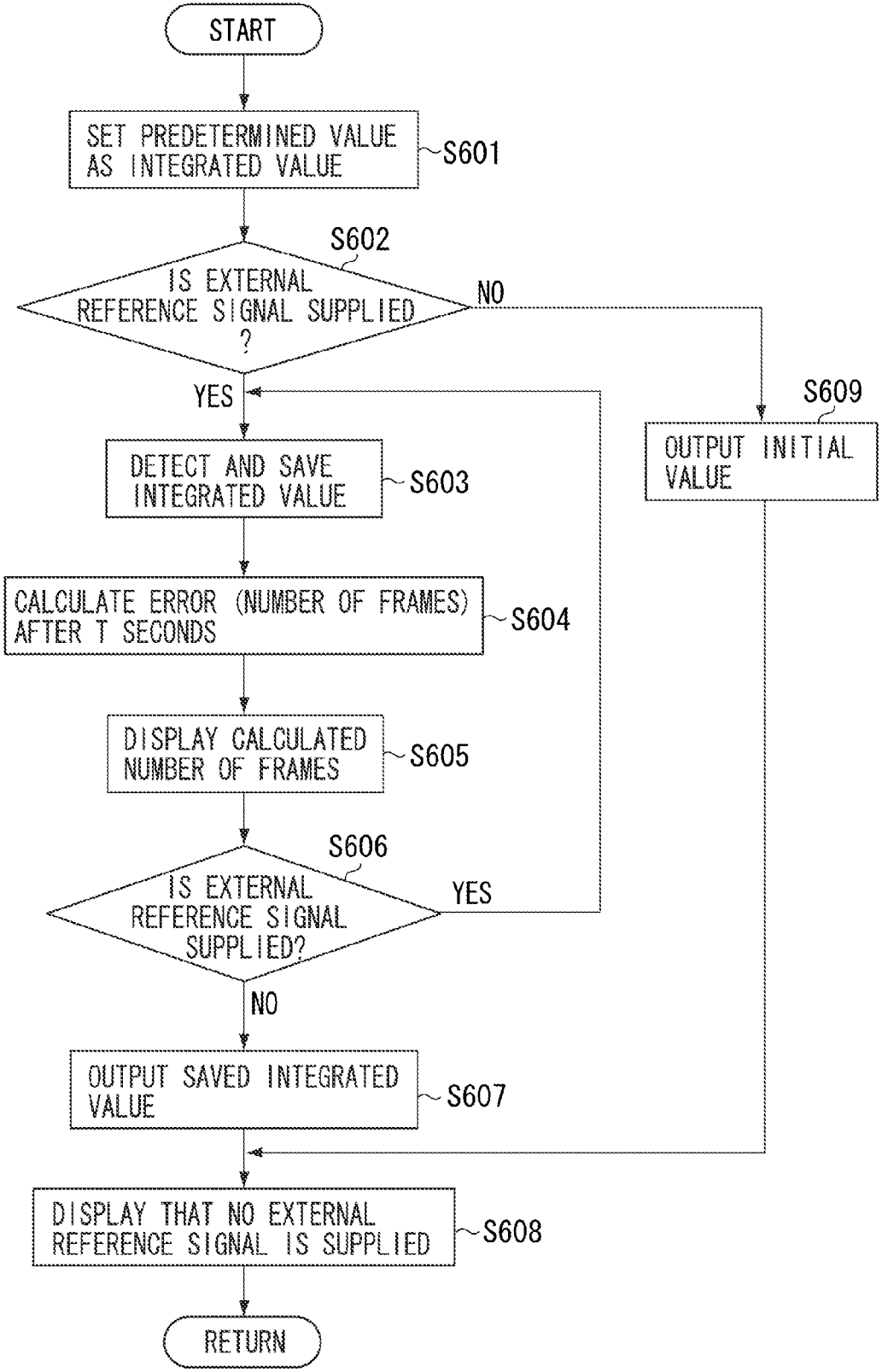
FIG. 6 is a flowchart illustrating the generator lock processing.

FIG. 6 is a flowchart illustrating the generator lock processing in the third exemplary embodiment. The CPU 106 controls the components to perform the processing in FIG. 6.

In step S601, when the user operates the operation unit 110 to set the generator lock mode, the CPU 106 sets a predetermined value as the initial value of the integrated value used in the loop filter 203. The initial value that is set in this step is the value used for oscillating the VCXO 209 under free-running conditions until the reference signal is supplied from an external device. This value, which is set at shipment time, is saved in the memory in the CPU 106.

Next, in step S602, the CPU 106 checks the input terminal 112 to determine if the reference signal is supplied from an external reference-signal generating device. If the reference signal is not supplied from the external device (NO in step S602), the CPU 106 outputs the initial value, which is set in step S601, to the terminal "b" of the switch 204. In addition, in step S609, the CPU 106 connects the switch 204 to the terminal "b" for supplying the initial value to the DVCO 205. In step S608, the CPU 106 controls the display control unit 104 and displays the information on the display unit 105 to indicate that no reference signal is supplied from the external device.

If the reference signal is supplied from the external device (YES in step S602), the CPU 106 connects the switch 204 to the terminal "a" for supplying the output of the loop filter 203 to the DVCO 205. At this time, the phase detection unit 202 detects the phase difference between the clock and the horizontal synchronization signal from the external device. The integrated value of the phase difference signal is accumulated in the register 225 of the loop filter 203.

After that, in step S603, the CPU 106 regularly acquires the output signal (integrated value) of the register 225 at a predetermined timing, and saves the acquired value in the internal register. The CPU 106 calculates the frequency deviation amount of the externally supplied reference signal based on the saved integrated value.

In step S604, based on this frequency deviation amount, the CPU 106 calculates the error (number of frames) between the time measured using the external reference signal and the time measured using the reference clock from the VCXO 209 that will be generated after T seconds (T is a predetermined value). In step S605, the CPU 106 displays the information on the calculated number of frames on the display unit 105 via the display control unit 104.

In step S606, the CPU 106 detects again if the reference signal is received. If the reference signal is received (YES in step S606), the processing returns to step S603. In this way, the CPU 106 calculates the error at periodic intervals while the reference signal is received from the external device, and displays the calculated error on the display unit 105.

If the supply of the external reference signal is stopped (NO in step S606), the CPU 106 connects the switch 204 to the terminal "b" and, in step S607, outputs the integrated value saved in step S603 to the DVCO 205. In step S608, the CPU 106 controls the display control unit 104 and displays the information on the display unit 105 to indicate that no reference signal is supplied from the external device.

Next, the calculation processing in step S604 and the display processing in step S605, will be described. The relational expressions are $$X = \Delta f \times 108000 \times T \text{ (NTSC broadcast method)}$$

$$X = \Delta f \times 90000 \times T \text{ (PAL broadcast method)} \qquad (6)$$

where $\Delta f$ is the frequency deviation and X is the error (frame deviation amount) between the result of the measurement for the period of T seconds using the reference clock from the VCXO 209 and the result of the measurement of the elapsed time using the reference signal.

Figure 7B:
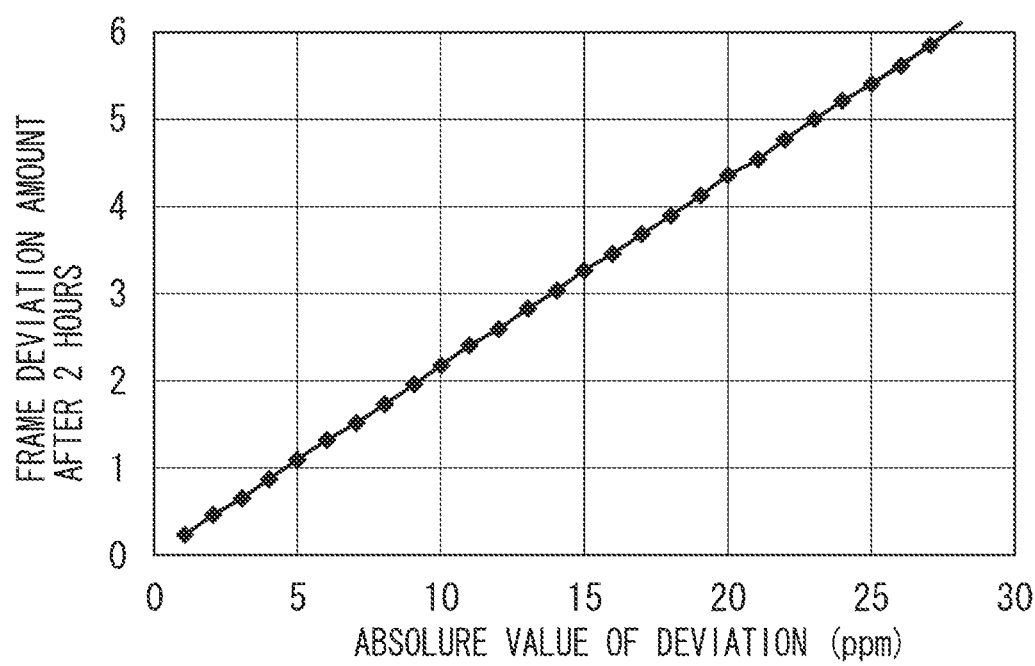

FIG. 7B illustrates the relation between the frame deviation amount X when two hours have elapsed and the frequency deviation amount $\Delta f$ in the NTSC broadcast method. In FIG. 7B, the horizontal axis indicates the absolute value of the amount of frequency deviation between the reference signal from the external device and the reference clock from the VCXO 209. The vertical axis in FIG. 7B indicates the frame deviation amount of the measurement result of the time measured using the reference signal when the elapsed time of the predetermined time T (two hours in this example) is measured using the reference clock.

The user can recognize the display during the generator lock processing to easily recognize the frame deviation amount that will be generated after a specified time. Therefore, to decrease the frame deviation amount after a specified time, the user can determine to frequently perform the generator lock processing.

In the present exemplary embodiment, the user can operate the operation unit 110 to arbitrarily change the time T used in steps S604 and S605. When the user changes T, the CPU 106 calculates the frame deviation amount again, which will be generated after the time T, using expression (6) and displays the result on the display unit 105.

Instead of the frame deviation amount after the time T, the time (in seconds) may also be displayed.

Although the present invention is applied to a video camera in the first to third exemplary embodiments, the present invention is applicable also to a device that generates a clock that synchronizes to the external reference signal.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-183270 filed Aug. 18, 2010, which is hereby incorporated by reference herein in its entirety.

What is claimed is:

1. A signal processing apparatus comprising:
   an input unit configured to receive a reference signal supplied from an external device;
   a phase detection unit configured to detect a phase difference between the reference signal received by the input unit and a clock signal;
   a generation unit configured to generate the clock signal with a frequency according to an output of the phase detection unit; and
   a control unit configured to detect an error between a frequency of the reference signal received by the input unit and the frequency of the clock signal based on an output of the phase detection unit and to output information indicating a status of a frequency change in the reference signal to a display device based on the detected error,
   wherein the control unit acquires the output signal of the phase detection unit at a predetermined interval and, based on a plurality of the acquired output signals of the phase detection unit, detects the frequency change in the reference signal.

2. The signal processing apparatus according to claim 1, wherein the generation unit generates the clock signal using a signal from a temperature-compensated oscillator.

3. The signal processing apparatus according to claim 1, wherein the control unit saves a value of an output signal of the phase detection unit if the frequency change in the reference signal is determined to be stable, and outputs the saved value to the generation unit instead of the output signal of the phase detection unit if the supply of the reference signal to the input unit is stopped.

4. The signal processing apparatus according to claim 1, further comprising a voltage-controlled crystal oscillator, wherein the control unit detects the frequency change in the reference signal based on a function indicating a change in the oscillation frequency of the voltage-controlled crystal oscillator.

5. The signal processing apparatus according to claim 1, further comprising:
   a processing unit configured to process a moving image signal having a plurality of frames in accordance with a timing signal generated from the clock signal,
   wherein the control unit outputs information indicating a time required until a deviation between a time measured using the clock and a time measured using the reference signal becomes N frames (N is a predetermined value) to the display unit based on the detected error.

6. The signal processing apparatus according to claim 1, wherein the control unit outputs information indicating a difference between a time measured using the clock signal and a time measured using the reference signal when a period of T seconds, T being a predetermined value, is measured using the clock signal to the display unit based on the detected error.

7. A signal processing method comprising:
   receiving a reference signal supplied from an external device;
   detecting a phase difference between the reference signal received by the input unit and a clock signal;
   generating the clock with a frequency corresponding to the detected phase difference; and
   detecting an error between a frequency of the received reference signal and the frequency of the clock signal based on the detected phase difference and outputting information indicating a status of a frequency change in the reference signal to a display device based on the detected error,
   including acquiring the detected phase difference at a predetermined interval and, based on a plurality of the acquired detected phase differences, detecting the frequency change in the reference signal.

8. The signal processing apparatus according to claim 1, wherein if the frequency change in the reference signal is determined to be stable, the control unit causes the information indicating the status of the frequency change in the reference signal to be displayed on the display device.

9. The signal processing apparatus according to claim 1, wherein if the frequency change in the reference signal is not determined to be stable, the control unit causes the information indicating the status of the frequency change in the reference signal not to be displayed on the display device.

10. A signal processing apparatus comprising:
    an input unit configured to receive a reference signal supplied from an external device;
    a phase detection unit configured to detect a phase difference between the reference signal received by the input unit and a clock signal;
    a generation unit configured to generate the clock signal with a frequency according to an output of the phase detection unit; and
    a control unit configured to detect a status of a frequency change in the reference signal based on an output of the phase detection unit and to output information indicating the status of the frequency change in the reference signal to a display device,
    wherein the control unit saves a value of the output signal of the phase detection unit if the frequency change in the reference signal is determined to be stable, and outputs the saved value to the generation unit instead of the output signal of the phase detection unit if the supply of the reference signal to the input unit is stopped.

11. A signal processing apparatus comprising:
    an input unit configured to receive a reference signal supplied from an external device;
    a phase detection unit configured to detect a phase difference between the reference signal received by the input unit and a clock signal;
    a generation unit configured to generate the clock signal with a frequency according to an output of the phase detection unit;
    a processing unit configured to process a moving image signal having a plurality of frames in accordance with the a timing signal generated from the clock signal; and
    a control unit configured to detect an error between a frequency of the reference signal received by the input unit and the frequency of the clock signal based on an output of the phase detection unit and to output information indicating a time required until a deviation between a time measured using the clock and a time measured using the reference signal becomes N frames (N is a predetermined value) to the display unit based on the detected error.

12. A signal processing apparatus comprising:
an input unit configured to receive a reference signal supplied from an external device;
a phase detection unit configured to detect a phase difference between the reference signal received by the input unit and a clock signal;
a generation unit configured to generate the clock signal with a frequency according to an output of the phase detection unit;
a processing unit configured to process a moving image signal having a plurality of frames in accordance with the a timing signal generated from the clock signal; and
a control unit configured to detect an error between a frequency of the reference signal received by the input unit and the frequency of the clock signal based on an output of the phase detection unit and to output information indicating a difference between a time measured using the clock signal and a time measured using the reference signal when a period of T seconds, T being a predetermined value, is measured using the clock signal to the display unit based on the detected error.

13. A signal processing apparatus comprising:
an input unit configured to receive a reference signal supplied from an external device;
a phase detection unit configured to detect a phase difference between the reference signal received by the input unit and a clock signal;
a generation unit configured to generate the clock signal with a frequency according to an output of the phase detection unit; and
a control unit configured to output information indicating a status of a frequency change in the reference signal to a display device based on an output signal of the phase detection unit,
wherein the control unit acquires the output signal of the phase detection unit at a predetermined interval and, based on a plurality of the acquired output signals of the phase detection unit, detects the status of the frequency change in the reference signal.

14. The signal processing apparatus according to claim 13, wherein if the frequency change in the reference signal is determined to be stable, the control unit causes the information indicating the status of the frequency change in the reference signal to be displayed on the display device.

15. The signal processing apparatus according to claim 13, wherein if the frequency change in the reference signal is not determined to be stable, the control unit causes the information indicating the status of the frequency change in the reference signal not to be displayed on the display device.

* * * * *